US012598956B2

(12) United States Patent
Minamide et al.

(10) Patent No.: US 12,598,956 B2
(45) Date of Patent: Apr. 7, 2026

(54) VAPOR DEPOSITION DEVICE AND VAPOR DEPOSITION METHOD

(71) Applicant: SUMCO CORPORATION, Tokyo (JP)

(72) Inventors: Yu Minamide, Tokyo (JP); Naoyuki Wada, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 182 days.

(21) Appl. No.: 17/786,388

(22) PCT Filed: Nov. 16, 2020

(86) PCT No.: PCT/JP2020/042596
§ 371 (c)(1),
(2) Date: Jun. 16, 2022

(87) PCT Pub. No.: WO2021/124756
PCT Pub. Date: Jun. 24, 2021

(65) Prior Publication Data
US 2023/0009579 A1 Jan. 12, 2023

(30) Foreign Application Priority Data
Dec. 19, 2019 (JP) ................................. 2019-228902

(51) Int. Cl.
*C23C 16/24* (2006.01)
*C23C 16/458* (2006.01)
(Continued)

(52) U.S. Cl.
CPC ........ *H01L 21/68742* (2013.01); *C23C 16/24* (2013.01); *C23C 16/4583* (2013.01); *C23C 16/52* (2013.01)

(58) Field of Classification Search
None
See application file for complete search history.

(56) References Cited

U.S. PATENT DOCUMENTS

| 7,998,308 B2 * | 8/2011 | Kaneko | ............. H01L 21/68728 |
| | | | 134/119 |
| 9,034,771 B1 * | 5/2015 | Nangoy | ............. H01J 37/32724 |
| | | | 438/710 |

(Continued)

FOREIGN PATENT DOCUMENTS

| CN | 107112265 | 8/2017 | |
| EP | 1569264 A1 * | 8/2005 | ......... C23C 16/4586 |

(Continued)

OTHER PUBLICATIONS

Office Action issued in Corresponding KR Patent Application No. 10-2022-7015947, dated Nov. 14, 2023, along with an English translation thereof.

(Continued)

*Primary Examiner* — Sylvia Macarthur
(74) *Attorney, Agent, or Firm* — Greenblum & Bernstein, P.L.C.

(57) ABSTRACT
A vapor deposition device is provided that can suppress an influence on an epitaxial layer which is caused by a position of a lift pin without adjusting an upper and lower heating ratio of a wafer. A reaction chamber is provided with a susceptor on which a carrier is placed, and a carrier lift pin which moves the carrier vertically relative to the susceptor; and the carrier lift pin is installed outside of an outer edge of the wafer when a state where the carrier supporting the wafer is mounted on the susceptor is viewed in a plan view.

4 Claims, 15 Drawing Sheets

(51) Int. Cl.
  *C23C 16/52* (2006.01)
  *H01L 21/687* (2006.01)

(56) References Cited

U.S. PATENT DOCUMENTS

|  |  |  |  |  |
|---|---|---|---|---|
| 9,080,253 | B2 * | 7/2015 | Wada | C30B 25/12 |
| 10,170,277 | B2 * | 1/2019 | Singh | H01J 37/32477 |
| 10,734,271 | B2 * | 8/2020 | Ota | H01L 21/68742 |
| 11,289,324 | B2 * | 3/2022 | Okutani | H01L 21/0206 |
| 11,508,560 | B2 * | 11/2022 | Zucker | H01L 21/67069 |
| 11,756,840 | B2 * | 9/2023 | Liu | H01L 22/12 |
|  |  |  |  | 156/345.1 |
| 2001/0037761 | A1 * | 11/2001 | Ries | C30B 25/12 |
|  |  |  |  | 423/328.1 |
| 2007/0119367 | A1 | 5/2007 | Kanaya et al. |  |
| 2010/0159679 | A1 * | 6/2010 | Wada | H01L 21/68742 |
|  |  |  |  | 438/507 |
| 2011/0114014 | A1 * | 5/2011 | Sakurai | C23C 16/4586 |
|  |  |  |  | 117/88 |
| 2012/0247671 | A1 | 10/2012 | Sugawara |  |
| 2014/0213055 | A1 * | 7/2014 | Himori | H01L 21/68742 |
|  |  |  |  | 438/689 |
| 2015/0221553 | A1 * | 8/2015 | Ouye | H01L 21/68742 |
|  |  |  |  | 156/345.37 |
| 2016/0204019 | A1 | 7/2016 | Ishii et al. |  |
| 2016/0211165 | A1 * | 7/2016 | McChesney | H01L 21/67069 |
| 2017/0110352 | A1 | 4/2017 | Tobin |  |
| 2018/0019145 | A1 | 1/2018 | Sugawara |  |
| 2018/0114717 | A1 | 4/2018 | Himori et al. |  |
| 2018/0182660 | A1 | 6/2018 | Ishii et al. |  |
| 2019/0109031 | A1 | 4/2019 | Sugawara |  |
| 2019/0252229 | A1 | 8/2019 | Ishii et al. |  |
| 2020/0303228 | A1 | 9/2020 | Ishii et al. |  |
| 2021/0123159 | A1 | 4/2021 | Minamide et al. |  |
| 2021/0183687 | A1 * | 6/2021 | Yan | H01L 21/68742 |
| 2023/0009579 | A1 * | 1/2023 | Minamide | H01L 21/68742 |

FOREIGN PATENT DOCUMENTS

|  |  |  |  |
|---|---|---|---|
| JP | 2000-021788 | 1/2000 |  |
| JP | 2012-216614 | 11/2012 |  |
| JP | 2013-042012 | 2/2013 |  |
| JP | 2018-536986 | 12/2018 |  |
| JP | 2019-121642 | 7/2019 |  |
| KR | 20170083383 | 7/2017 |  |
| TW | 201941333 | 10/2019 |  |
| WO | WO-2004055874 A1 * | 7/2004 | C23C 16/4586 |
| WO | 2005/034219 | 4/2005 |  |
| WO | 2017/066418 | 4/2017 |  |

OTHER PUBLICATIONS

International Search Report issued in Corresponding International Patent Appl. No. PCT/JP2020/042596, dated Dec. 8, 2020, along with an English translation thereof.

Office Action issued in Corresponding Taiwanese Patent Application No. 109139696, dated Jun. 22, 2021, along with an English translation thereof.

* cited by examiner

VAPOR DEPOSITION DEVICE AND VAPOR DEPOSITION METHOD

FIELD OF THE INVENTION

The present invention relates to a vapor deposition device and a vapor deposition method used in manufacturing epitaxial wafers, for example.

BACKGROUND OF THE INVENTION

In a vapor deposition device for performing a vapor deposition of a silicon epitaxial layer on a silicon wafer, it is known that, when the silicon wafer that is mounted on a susceptor in a reaction container is heated, a surface shape of the silicon epitaxial layer on the silicon wafer which is formed near a lift pin is controlled and the silicon epitaxial layer is flattened by adjusting the heating ratio of a heating device which is arranged on an upper side and a lower side of the susceptor (Patent Literature 1).

RELATED ART

Patent Literature

Patent Literature 1: International Publication No. 2005/034219

SUMMARY OF THE INVENTION

Problems to be Solved by the Invention

In the conventional technology mentioned above, at the time of heating, heat is released below the susceptor through the lift pin, and therefore, the surface shape of the silicon epitaxial layer is negatively affected depending on the position of the lift pin. For this reason, the negative influence is reduced by adjusting the heating device. Even when heating ratio of the wafer heating device is adjusted, however, the position of the lift pin has a considerable effect on the surface shape of the silicon epitaxial layer.

The present invention undertakes to solve the issue of providing a vapor deposition device and a vapor deposition method which can suppress the influence on the epitaxial layer which is caused by the position of a carrier lift pin, without adjusting the heat of the wafer.

Means for Solving the Problems

The present invention is a vapor deposition device, which is provided with a reaction chamber for forming a CVD film on a wafer using a ring-shaped carrier that supports an outer periphery of the wafer, wherein the reaction chamber is provided with the susceptor on which the carrier supporting the wafer is placed, and the carrier lift pin which moves the carrier supporting the wafer vertically relative to the susceptor; and the carrier lift pin is installed outside of an outer edge of the wafer when a state where the carrier supporting the wafer is mounted on the susceptor is viewed in a plan view.

More preferably, in the present invention, the carrier lift pin is installed such that a center of the carrier lift pin exists outside of the outer edge of the wafer by 7 mm or more when the susceptor supporting the carrier on which the wafer is placed is viewed in the plan view.

More preferably, in the present invention, the CVD film is a silicon epitaxial film.

More preferably, in the present invention, a plurality of before-treatment wafers are transported from a wafer storage container, through a factory interface, a load-lock chamber, and a wafer transfer chamber to the reaction chamber that forms the CVD film on the wafers in that order; and additionally, a plurality of after-treatment wafers are transported from the reaction chamber, through the wafer transfer chamber, the load-lock chamber, and the factory interface to the wafer storage container in that order; and the load-lock chamber communicates with the factory interface via a first door and also communicates with the wafer transfer chamber via a second door; the wafer transfer chamber communicates with the reaction chamber via a gate valve; the wafer transfer chamber is provided with a first robot that deposits the before-treatment wafer, transported into the load-lock chamber, into the reaction chamber in a state where the before-treatment wafer is supported on the carrier and also, for the after-treatment wafer for which treatment in the reaction chamber has ended, withdraws the after-treatment wafer from the reaction chamber in a state where the after-treatment wafer is supported on the carrier and transports the wafer to the load-lock chambers; the factory interface is provided with a second robot which extracts the before-treatment wafer from the wafer storage container and supports the wafer by the carrier standing by in the load-lock chamber and also stores in the wafer storage container the after-treatment wafer supported on the carrier that has been transported to the load-lock chamber; and the load-lock chamber is provided with a holder for supporting the carrier.

In addition, the present invention is a vapor deposition method which uses a ring-shaped carrier that supports an outer periphery of the wafer to form CVD film on the wafer in the reaction chamber, wherein the reaction chamber is provided with the susceptor on which the carrier supporting the wafer is placed, and the carrier lift pin which moves the carrier supporting the wafer vertically relative to the susceptor; and the carrier lift pin is installed outside of the outer edge of the wafer when a state where the carrier supporting the wafer is mounted on the susceptor is viewed in the plan view.

More preferably, in the present invention, the CVD film is the silicon epitaxial film.

More preferably, in the present invention, the plurality of before-treatment wafers are transported from the wafer storage container, through the factory interface, the load-lock chamber, and the wafer transfer chamber to the reaction chamber that forms the CVD film on the wafer in that order; and additionally, the plurality of after-treatment wafers are transported from the reaction chamber, through the wafer transfer chamber, the load-lock chamber, and the factory interface to the wafer storage container in that order.

Effect of the Invention

According to the present invention, the influence on the epitaxial layer which is caused by the position of the carrier lift pin can be suppressed, without adjusting the heat of the wafer.

MODE FOR CARRYING OUT THE INVENTION

Figure 1:
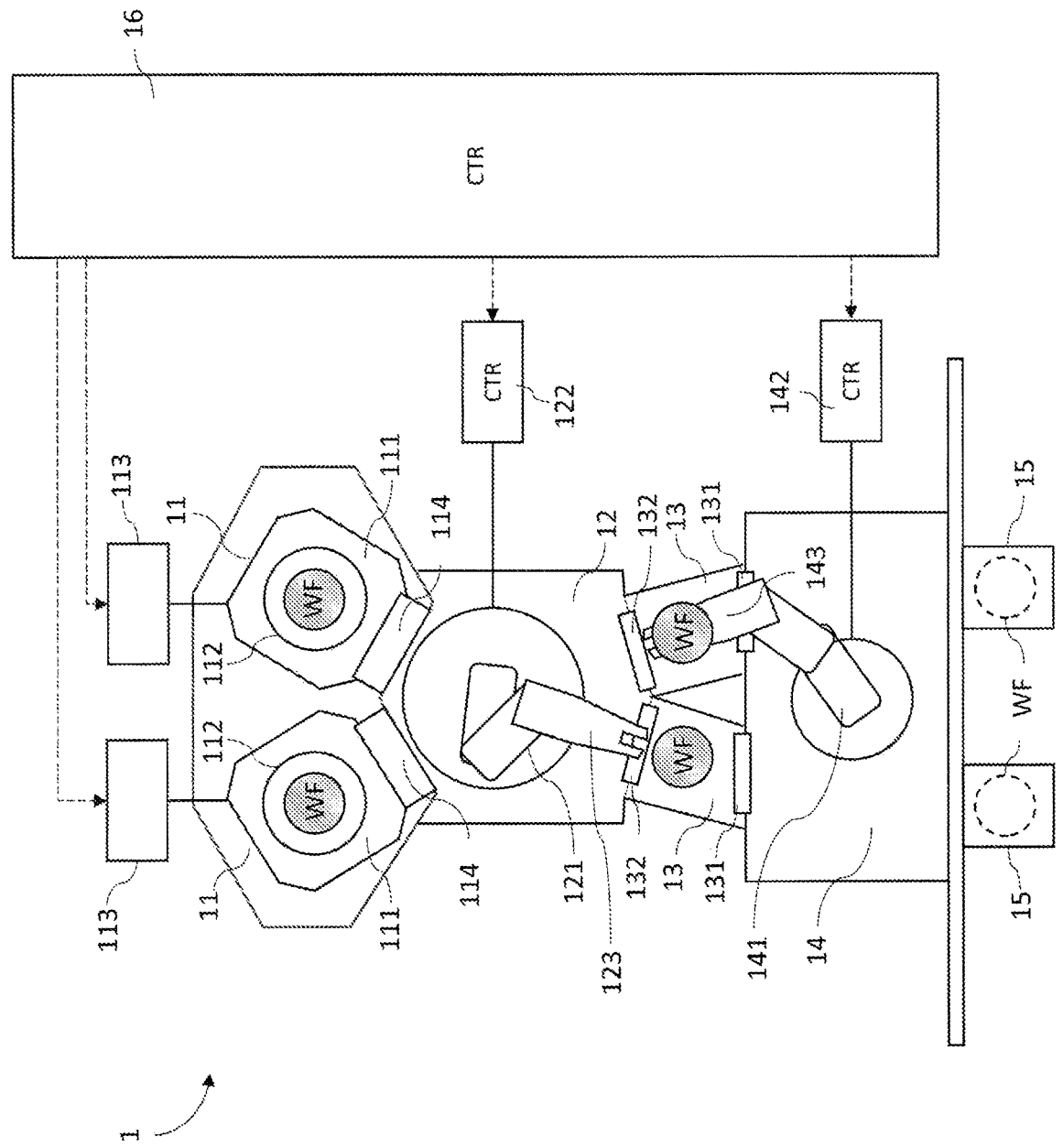
[FIG. 1] is a block diagram illustrating a vapor deposition device according to an embodiment of the present invention.

Hereafter, an embodiment of the present invention is described with reference to the drawings. FIG. 1 is a block diagram illustrating a vapor deposition device 1 according to an embodiment of the present invention. A main body of the vapor deposition device 1 shown in the center of FIG. 1 is illustrated as a plan view. The vapor deposition device 1 of the present embodiment is what is known as a CVD device. The vapor deposition device 1 of the present embodiment is provided with a pair of reaction furnaces 11,11; a wafer transfer chamber 12 in which is installed a first robot 121 that handles a wafer WF, such as a single crystal silicon wafer; a pair of load-lock chambers 13; a factory interface 14 in which is installed a second robot 141 that handles the wafer WF; and a load port in which is installed a wafer storage container 15 (cassette case) in which a plurality of the wafers WF are stored.

The factory interface 14 is a zone configured to have the same air atmosphere as a clean room in which the wafer storage container 15 is mounted. The factory interface 14 is provided with the second robot 141, which extracts a before-treatment wafer WF that is stored in the wafer storage container 15 and deposits the wafer WF in the load-lock chamber 13, and also stores an after-treatment wafer WF transported to the load-lock chamber 13 in the wafer storage container 15. The second robot 141 is controlled by a second robot controller 142, and a second blade 143 mounted on a distal end of a robot hand displaces along a predetermined trajectory that has been taught in advance.

The load-lock chamber 13 is a space where atmospheric gas exchange takes place between the wafer transfer chamber 12, which is configured to have an inert gas atmosphere, and the factory interface 14, which is configured to have an air atmosphere. A first door 131 capable of opening and closing with an airtight seal is provided between the load-lock chamber 13 and the factory interface 14, while a second door 132 similarly capable of opening and closing with an airtight seal is provided between the load-lock chamber 13 and the wafer transfer chamber 12. For exchanging an air atmosphere with an inert gas atmosphere, the load-lock chamber 13 is provided with an exhaust device that evacuates an interior of the load lock chamber 13 to vacuum and a supply device that supplies inert gas to the load-lock chamber 13.

For example, when a before-treatment wafer WF is transported from the wafer storage container 15 to the wafer transfer chamber 12, in a state where the first door 131 on the factory interface 14 side is closed, the second door 132 on the wafer transfer chamber 12 side is closed, and the load-lock chamber 13 has an inert gas atmosphere, the wafer WF is extracted from the wafer storage container 15 using the second robot 141, the first door 131 on the factory interface 14 side is opened, and the wafer WF is transported to the load-lock chamber 13. Next, after the first door 131 on the factory interface 14 side is closed and the load-lock chamber 13 is restored to an inert gas atmosphere, the second door 132 on the wafer transfer chamber 12 side is opened and the wafer WF is transported to the wafer transfer chamber 12 using the first robot 121.

Conversely, when an after-treatment wafer WF is transported from the wafer transfer chamber 12 to the wafer storage container 15, in a state where the first door 131 on the factory interface 14 side is closed, the second door 132 on the wafer transfer chamber 12 side is closed, and the load-lock chamber 13 has an inert gas atmosphere, the second door 132 on the wafer transfer chamber 12 side is opened and the wafer WF in the wafer transfer chamber 12 is transported to the load-lock chamber 13 using the first robot 121. Next, after the second door 132 on the wafer transfer chamber 12 side is closed and the load-lock chamber 13 is restored to an inert gas atmosphere, the first door 131 on the factory interface 14 side is opened and the wafer WF is transported to the wafer storage container 15 using the second robot 141.

The wafer transfer chamber 12 is configured by a sealed chamber. One side of the water transfer chamber 12 is connected to the load-lock chamber 13 via the second door 132 that is capable of opening and closing and has an airtight seal, and the other side is connected via a gate valve 114 that is capable of opening and closing and has an airtight seal. The first robot 121, which transports the before-treatment wafer WF from the load-lock chamber 13 to a reaction chamber 111 and transports the after-treatment wafer WF from the reaction chamber 111 to the load-lock chamber 13, is installed on the wafer transfer chamber 12. The first robot 121 is controlled by a first robot controller 122, and a first blade 123 mounted on a distal end of a robot hand displaces along an operation trajectory that has been taught in advance.

An integrated controller 16 that integrates control of the entire vapor deposition device 1, the first robot controller 122, and the second robot controller 142 send and receive control signals amongst each other. In addition, when an operation command signal from the integrated controller 16 is sent to the first robot controller 122, the first robot controller 122 controls the operation of the first robot 121, and an operation result of the first robot 121 is sent from the first robot controller 122 to the integrated controller 16. Accordingly, the integrated controller 16 recognizes an operation status of the first robot 121. Similarly, when an operation command signal from the integrated controller 16 is sent to the second robot controller 142, the second robot controller 142 controls the operation of the second robot 141, and an operation result of the second robot 141 is sent from the second robot controller 142 to the integrated controller 16. Accordingly, the integrated controller 16 recognizes an operation status of the second robot 141.

Inert gas is supplied to the wafer transfer chamber 12 from an inert gas supply device not shown in the drawings, and gas in the wafer transfer chamber 12 is cleaned with a scrubber (scrubbing dust collector) that is connected to an exhaust port, after which the gas is released outside the system. Although a detailed depiction is omitted, this type of scrubber can use a conventionally known pressurized water scrubber, for example.

The reaction furnace 11 is a device for growing an epitaxial film on a surface of the wafer WF using a CVD method. The reaction furnace 11 includes the reaction chamber 111; a susceptor 112 on which the wafer WF is placed and rotated is provided inside the reaction chamber 111; and a gas supply device 113 is also provided that supplies hydrogen gas and raw material gas for growing a CVD film (when the CVD film is a silicon epitaxial film, the raw material gas may be dichlorosilane $SiH_2Cl_2$ or trichlorosilane $SiHCl_3$, for example) to the reaction chamber 111. In addition, a heat lamp for raising the temperature of the wafer WF to a predetermined temperature is provided around the circumference of the reaction chamber 111 (not shown in the drawings). Moreover, the gate valve 114 is provided between the reaction chamber 111 and the wafer transfer chamber 12, and airtightness with the wafer transfer chamber 12 of the reaction chamber 111 is ensured by closing the gate valve 114. Various controls, such as driving the susceptor 112 of the reaction furnace 11, supply and stoppage of gas by the gas supply device 113, turning the heat lamp on and off, and opening and closing the gate valve 114, are controlled by a command signal from the integrated controller 16. The vapor deposition device 1 shown in FIG. 1 depicts an example provided with a pair of reaction furnaces 11, 11, but vapor deposition device 1 may have one reaction furnace 11 or three or more reaction furnaces.

A scrubber (scrubbing dust collector) having a similar configuration to that of the wafer transfer chamber 12 is provided to the reaction furnace 11. In other words, hydrogen gas or raw material gas supplied from the gas supply device 113 is cleaned by the scrubber connected to an exhaust port provided to the reaction chamber 111 and is then released outside the system. A conventionally known pressurized water scrubber, for example, can be used for this scrubber, as well.

Figure 2A:
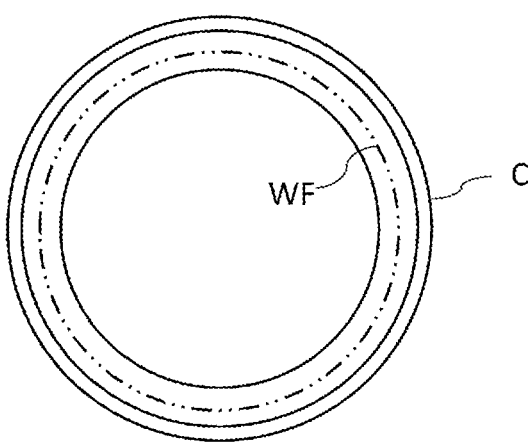
[FIG. 2A] is a plan view illustrating a carrier according to the embodiment of the present invention.

In the vapor deposition device 1 according to the present embodiment, the wafer WF is transported between the load-lock chamber 13 and the reaction chamber 111 using a ring-shaped carrier C that supports an outer periphery of the wafer WF. FIG. 2A is a plan view of the carrier C, FIG. 2B is a cross-sectional view of the carrier C, including the wafer WF and the susceptor 112 of the reaction furnace 11, and FIG. 5 is a plan view and cross-sectional views illustrating a transfer protocol for the wafer WF and the carrier C within the reaction chamber 111.

Figure 2B:
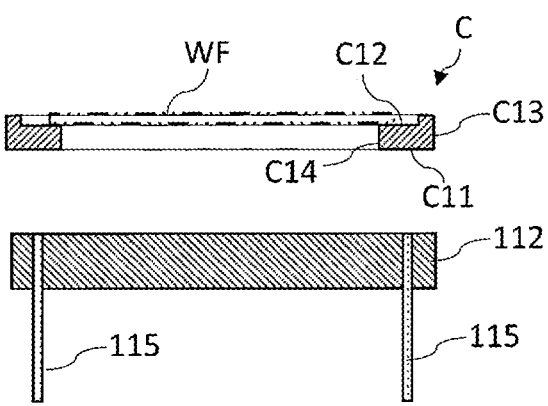
[FIG. 2B] is a cross-sectional view of the carrier, including a wafer and a reaction furnace susceptor in the vapor deposition device of FIG. 1.

The carrier C according to the present embodiment is configured by a material such as ceramics like SiC and $SiO_2$, or glassy carbon, for example; is formed in an endless ring shape; and includes a bottom surface C11 that rests on a top surface of the susceptor 112 shown in FIG. 2B, a top surface C12 that touches and supports the entire outer periphery of a reverse face of the wafer WF, an outer circumferential wall surface C13, and an inner circumferential wall surface C14. And, when the wafer WF supported by the carrier C is transported into the reaction chamber 111, in a state where the carrier C rests on the first blade 123 of the first robot 121 as illustrated in the plan view of FIG. 5A, the wafer WF is transported to a top portion of the susceptor 112 as illustrated in FIG. 5B, the carrier C is temporarily lifted by three or more carrier lifting pins 115 provided relatively to the susceptor 112 so as to be capable of displacing vertically as illustrated in FIG. 5C, and the first blade 123 is retracted as illustrated in FIG. 5D, after which the susceptor 112 is raised as illustrated in FIG. 5E, thereby placing the carrier C on the top surface of the susceptor 112.

Figures 5A, 5B, 5C, 5D, 5E:
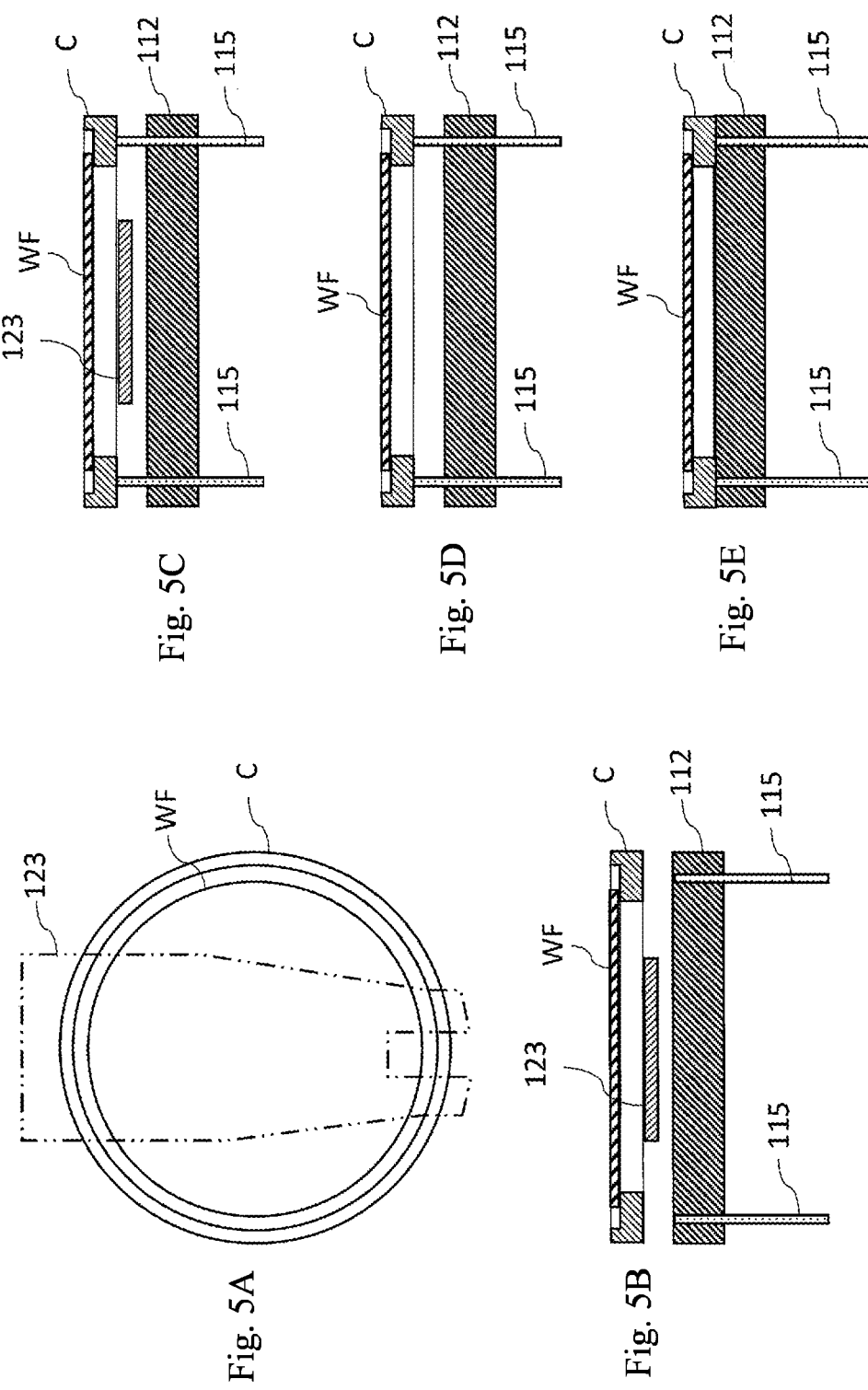
[FIGS. 5A-5E] are a plan view and cross-sectional views illustrating a transfer protocol for the wafer and the carrier within a reaction chamber in the vapor deposition device of FIG. 1.

Conversely, when treatment in the reaction chamber 111 has ended for the wafer WF and the wafer WF is withdrawn in a state mounted on the carrier C, the susceptor 112 is lowered from the state illustrated in FIG. 5E and supports the carrier C with only the carrier lifting pins 115 as illustrated in FIG. 5D, the first blade 123 is advanced between the carrier C and the susceptor 112 as illustrated in FIG. 5C, and then the three carrier lifting pins 115 are lowered to rest the carrier C on the first blade 123 as illustrated in FIG. 5B, and the hand of the first robot 121 is operated. In this way, the wafer WF for which treatment has ended can be withdrawn in a state mounted on the carrier C.

In particular, in the reaction furnace 11 of the vapor deposition device 1 of the present embodiment, the carrier lift pins 115 are provided so as to be positioned outside of the outer edge of the wafer WF when a state where the carrier C on which the wafer WF is placed is mounted on the susceptor 112 is viewed in the plan view. By installing the carrier lift pins 115 outside of the outer edge of the wafer WF, when the wafer WF is heated, the influence on the wafer WF caused by heat release from the carrier lift pins 115 is reduced, and thereby, the influence on a surface shape of the CVD film which is caused by the carrier lift pins can be suppressed.

Figure 7:
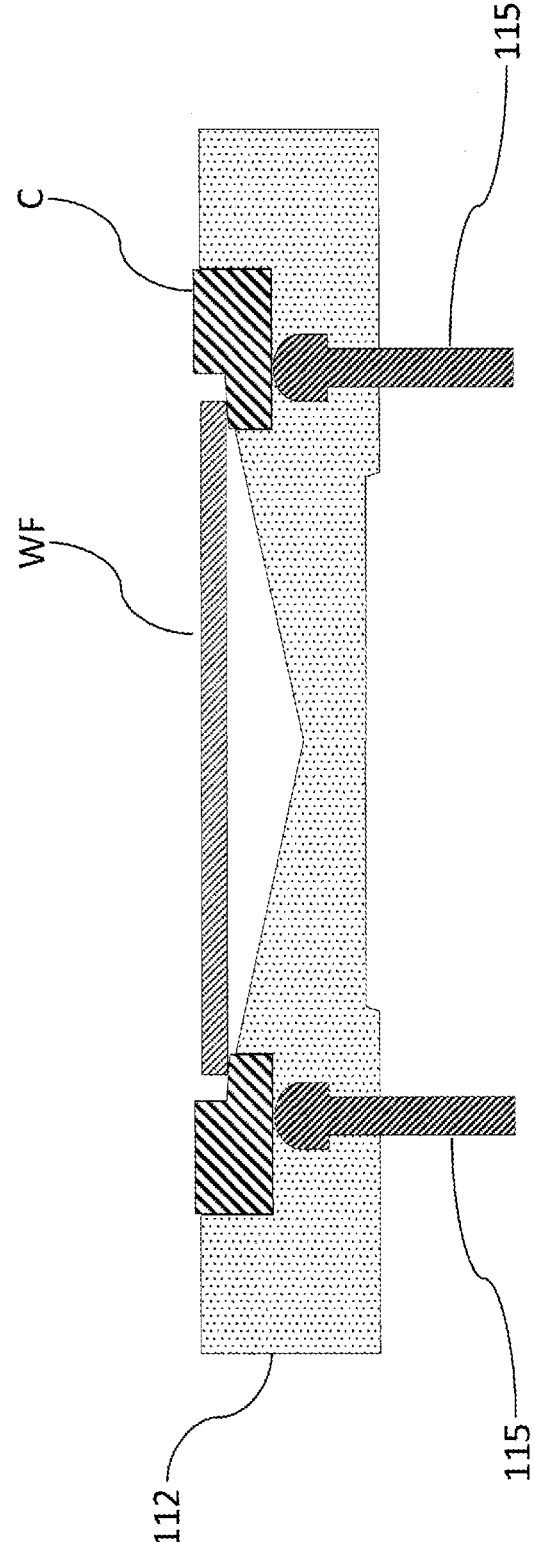
[FIG. 7] is a cross-sectional view illustrating an exemplary positional relationship between the wafer, the carrier, the susceptor and carrier lift pins in the reaction chamber of the vapor deposition device of FIG. 1.
Figure 8:
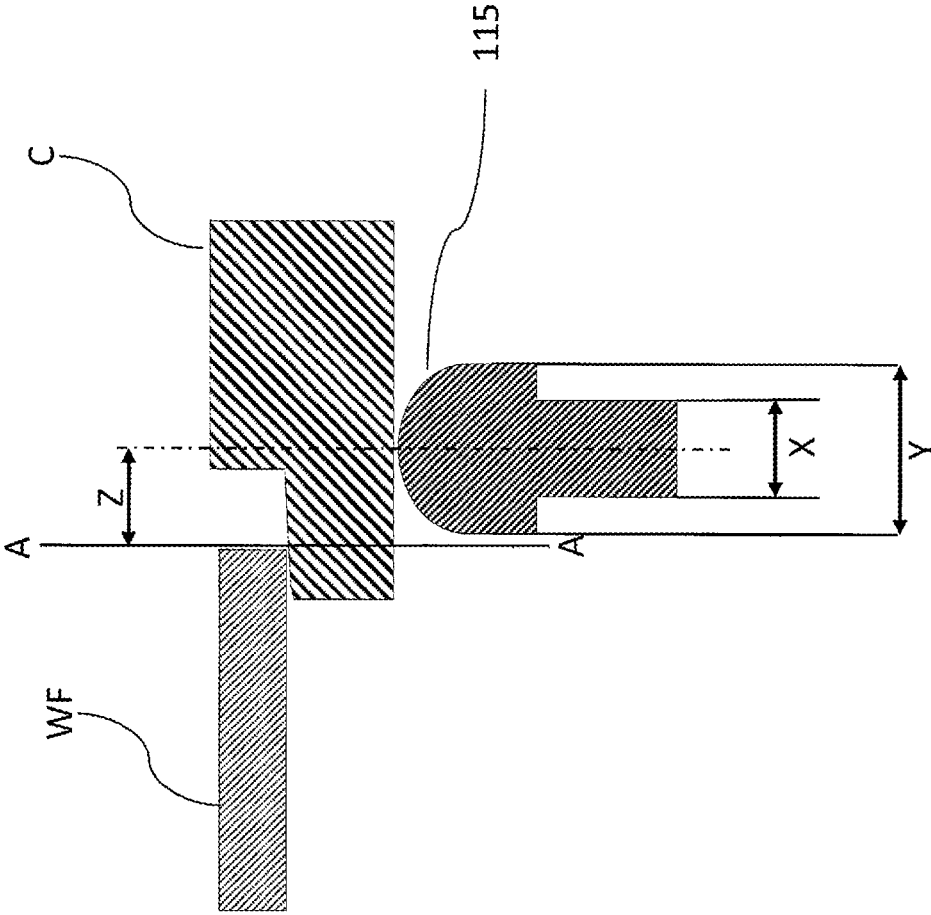
[FIG. 8] is a cross-sectional view showing an enlarged right-side portion of FIG. 7.

In the reaction furnace 11 of the vapor deposition device 1 of the present embodiment, the carrier lift pins 115 are arranged in a positional relationship, as illustrated in FIG. 7, for example. FIG. 7 is a cross-sectional view illustrating the wafer WF, the carrier C, the susceptor 112, and the carrier lift pins 115 when the vapor deposition device 1 is cut across in a vertical direction, when the carrier C on which the wafer WF is placed is mounted on the susceptor 112, in the reaction furnace 11 of the vapor deposition device 1 of the present embodiment. In addition, FIG. 8 is a view in which only a right-side portion of the cross-sectional view of FIG. 7 is enlarged, and to make explanations easier to understand, the susceptor 112 is not shown in the drawing. A straight line AA in FIG. 8 corresponds to the outer edge of the wafer WF when the reaction furnace 11 of the vapor deposition device 1 of the present embodiment is viewed in the plan view. As illustrated in FIGS. 7 and 8, the carrier lift pins 115 of the present embodiment are provided so as to be positioned outside of the outer edge of the wafer WF.

In the reaction furnace 11 of the vapor deposition device 1 of the present embodiment, the carrier lift pins 115 are configured by a material such as ceramics like SiC and $SiO_2$, or glassy carbon, for example. In addition, in the reaction furnace 11 of the vapor deposition device 1 of the present embodiment, the shape of the carrier lift pins 115 is not particularly limited, and may be round-head pins as illustrated in FIGS. 7 and 8. A diameter X of an axis of the round-head pins is 3.8 mm, for example, and a diameter Y of the thickest portion of the round head of the pins is 5.6 mm, for example. When the carrier lift pins 115 are used in the reaction furnace 11 of the vapor deposition device 1 of the present embodiment, the carrier lift pins 115 are arranged so that a distance Z between the outer edge of the wafer WF and the center of the carrier lift pins 115 is larger than 2.8 mm.

In the reaction furnace 11 of the vapor deposition device 1 of the present embodiment, the lower limit of how far the distance between the carrier lift pins 115 and the outer edge of the wafer WF at least should be is not particularly limited, and the distance is defined by the shape of the carrier lift pins 115 and the like. However, in order to further suppress the influence on the CVD film which is caused by the carrier lift pins 115, the carrier lift pins 115 are preferred to be arranged so that the distance Z between the outer edge of the wafer WF and the center of the carrier lift pins 115 is 7 mm or more. This is because, when the reaction furnace 11 of the vapor deposition device 1 is viewed in the plan view, and when the centers of the carrier lift pins 115 are positioned at the outer edge of the wafer WF, the carrier lift pins 115 affect the surface shape of the CVD film which is formed on the wafer WF in a range up to 7 mm of the outer edge of the wafer WF from the central position of the carrier lift pins 115. The range in which the carrier lift pins 115 affect the CVD film is based on a thickness profile of the outer periphery of the silicon epitaxial film illustrated in FIG. 9, which is described below.

Figure 9:
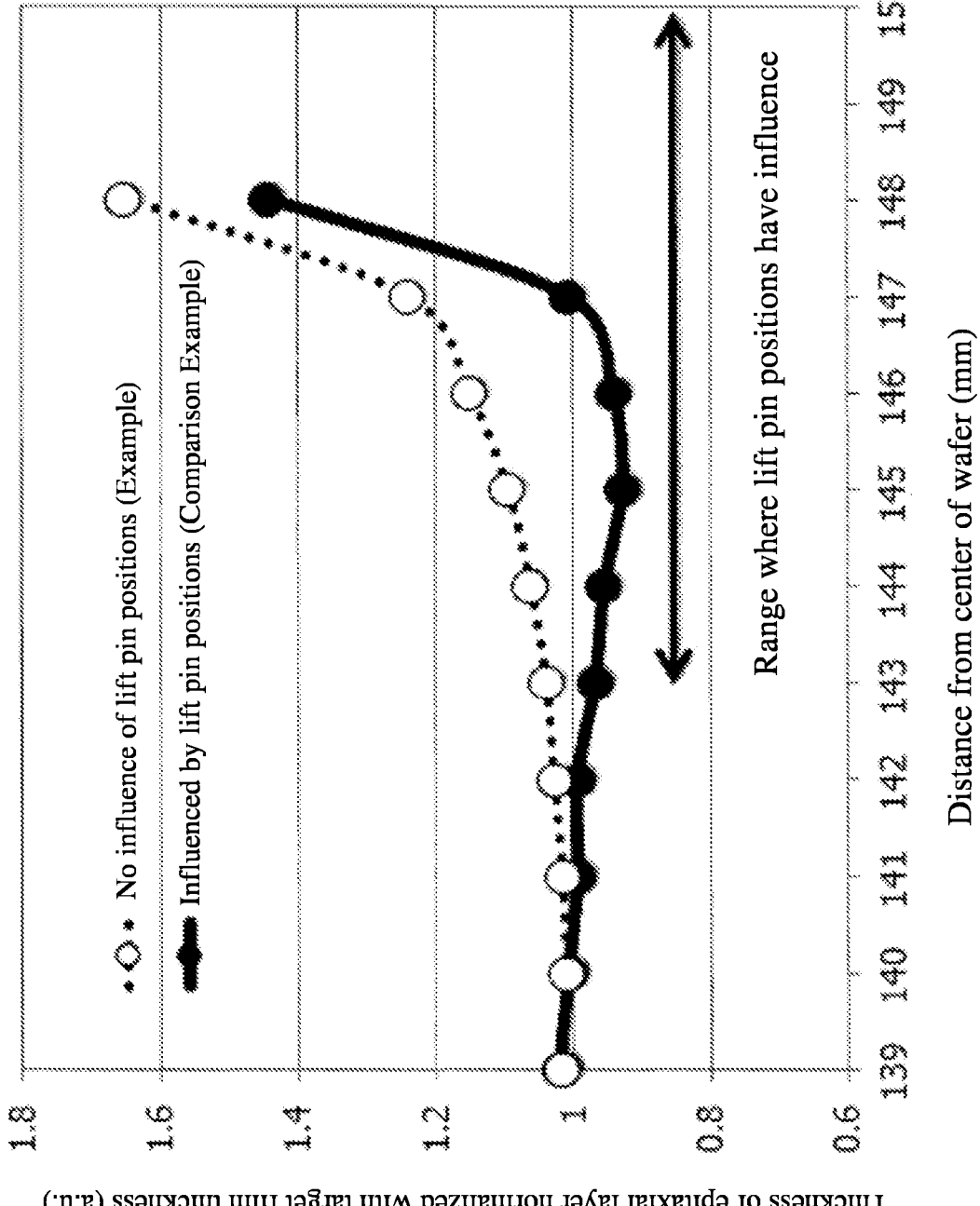
[FIG. 9] is a profile (an example and a comparison example) illustrating a thickness of an outer periphery of a silicon epitaxial film which is formed using the vapor deposition device of FIG. 1.

FIG. 9 illustrates the thickness profile of the outer periphery of the silicon epitaxial film formed when the treatment of a 12-inch wafer WF is performed using the reaction furnace 11 of the vapor deposition device 1. The vertical axis represents the thickness of the epitaxial layer (values being normalized with the target film thickness being 1), and the horizontal axis represents the distance from the center of the wafer (in the unit of mm). An example (indicated by circle marks in FIG. 9) in which the positions where the carrier lift pins 115 are arranged are outside of the outer edge of the wafer has a thickness profile of the outer periphery of the silicon epitaxial film as illustrated by a broken line in FIG. 9. In contrast, a comparison example (indicated by solid-circle marks in FIG. 9) in which the positions where the carrier lift pins 115 are arranged are not outside of the outer edge of the wafer has a thickness profile of the outer periphery of the silicon epitaxial film as illustrated by a solid line in FIG. 9. In other words, the thickness profile of the outer periphery of the silicon epitaxial film concerning the comparison example indicated by the solid-circle marks and the solid line in FIG. 9 is an example, when the reaction furnace 11 of the vapor deposition chamber 1 is viewed in the plan view, of a profile which is obtained when the centers of the carrier lift pins 115 are positioned at the outer edge of the wafer WF, in other words, such that the centers of the carrier lift pins 115 are arranged at the 150 mm position of the horizontal axis of FIG. 9. As illustrated by the profile with the solid-circle marks and the solid line in FIG. 9, the carrier lift pins 115 affect the thickness of the silicon epitaxial film in outside of a vicinity of 143 mm from the center of the wafer WF, that is, in a range up to 7 mm toward the inside from the outer edge of the wafer WF. The present inventors have confirmed that the range up to 7 mm from the outer edge of the wafer WF does not depend on the diameter of the wafer WF.

On the other hand, in the reaction furnace 11 of the vapor deposition device 1 of the present embodiment, the upper limit of the distance between the carrier lift pins 115 and the outer edge of the wafer WF is not particularly limited, and the distance is set to an appropriate value by the diameter of the carrier C, the diameter of the susceptor 112, the size of a transport route of the wafer WF of the vapor deposition device 1, and the like.

Figure 3A:
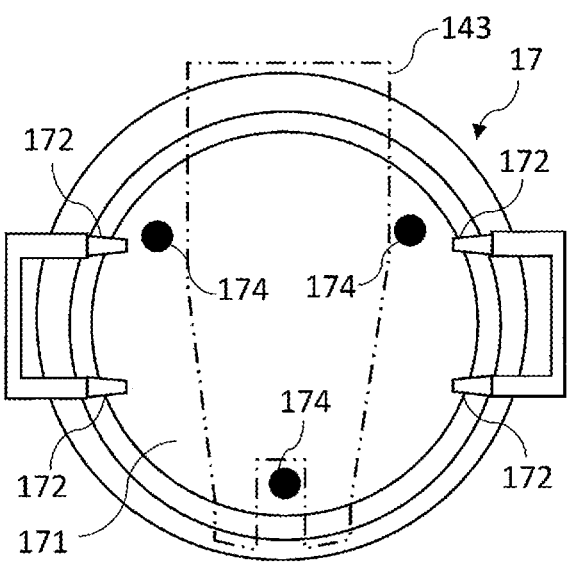
[FIG. 3A] is a plan view illustrating a holder provided to a load-lock chamber in the vapor deposition device of FIG. 1.
Figure 3B:
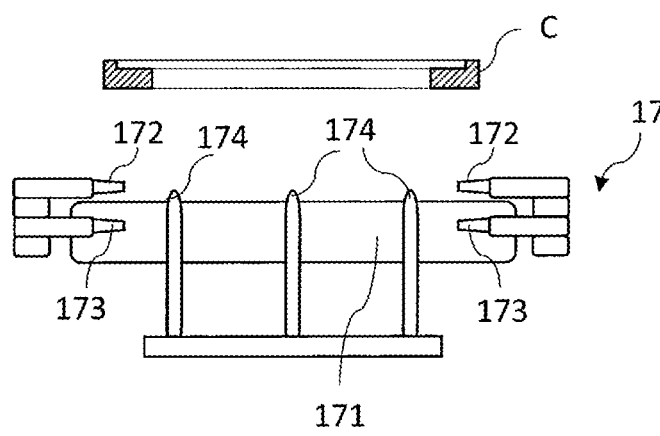
[FIG. 3B] is a cross-sectional view of the holder, including the carrier in the vapor deposition device of FIG. 1.

Also, in the vapor deposition device 1 of the present embodiment, in order to transport the carrier C between processes running from the load-lock chamber 13 to the reaction chamber 111, in the load-lock chamber 13, the before-treatment wafer WF is placed on the carrier C and the after-treatment wafer WF is removed from the carrier C. Therefore, the load-lock chamber 13 is provided with a holder 17 that supports the carrier C at two vertical levels. FIG. 3A is a plan view illustrating the holder 17 that is provided to the load-lock chamber 13, and FIG. 3B is a cross-sectional view of the holder 17. The holders 17 of the present embodiment includes a fixed holder base 171; a first holder 172 and a second holder 173 that support two carriers C at two vertical levels, and that are provided to the holder base 171 so as to be capable of lifting and lowering vertically; and three wafer lifting pins 174 that are provided to the holder base 171 so as to be capable of lifting and lowering vertically.

The first holder 172 and the second holder 173 (in the plan view of FIG. 3A, the second holder 173 is obscured by the first holder 172 and therefore only the first holder 172 is depicted) have projections for supporting the carrier C at four points, and one carrier C is placed on the first holder 172 and another carrier C is placed on the second holder 173. The carrier C that rests on the second holder 173 is inserted into a gap between the first holder 172 and the second holder 173.

Figures 4A, 4B, 4C, 4D, 4E:
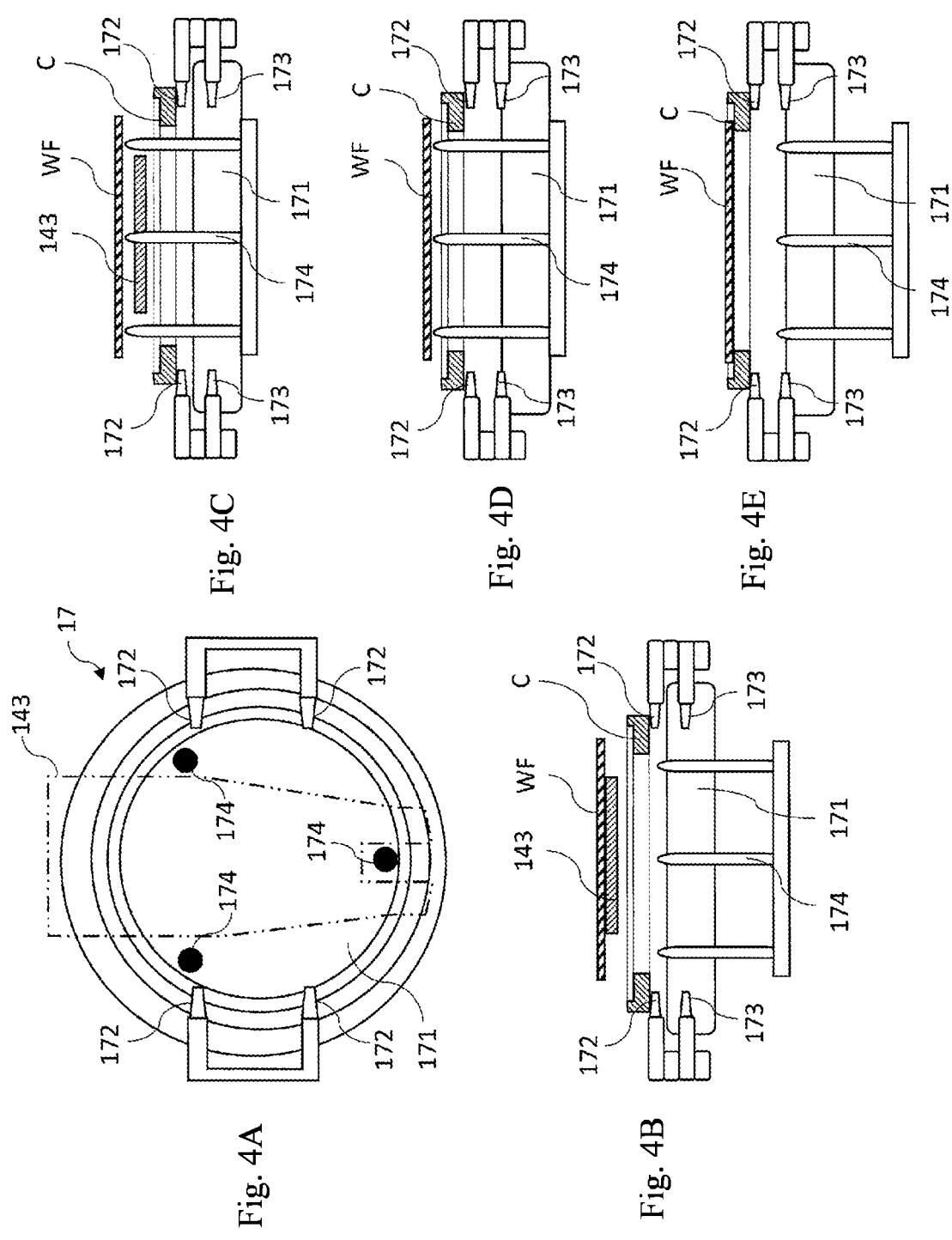
[FIGS. 4A-4E] are a plan view and cross-sectional views illustrating a transfer protocol for the wafer and the carrier in the load-lock chamber in the vapor deposition device of FIG. 1.

FIG. 4 is a plan view and cross-sectional views of a transfer protocol for the wafer WF and carrier C in the load-lock chamber 13 and depicts a protocol in which a before-treatment wafer WF rests on the carrier C in a state where the carrier C is supported by the first holder 172, as illustrated in FIG. 4B. In other words, the second robot 141 that is provided to the factory interface 14 loads one wafer WF that is stored in the wafer storage container 15 onto the second blade 143 and transports the wafer WF via the first door 131 of the load-lock chamber 13 to a top portion of the holder 17, as illustrated in FIG. 4B. Next, as illustrated in FIG. 4C, the three wafer lifting pins 174 are raised relative to the holder base 171 and temporarily hold up the wafer WF, and the second blade 143 is retracted as illustrated in FIG. 4D. The three wafer lifting pins 174 are provided in positions that do not interfere with the second blade 143, as illustrated in the plan view of FIG. 4A. Next, as illustrated in FIGS. 4D and 4E, the three wafer lifting pins 174 are lowered and the first holder 172 and the second holder 173 are raised, whereby the wafer WF is placed on the carrier C.

Conversely, when the after-treatment wafer WF transported to the load-lock chamber 13 in a state resting on the carrier C is transported to the wafer storage container 15, as illustrated in FIG. 4D, the three wafer lifting pins 174 are raised and the first holder 172 and the second holder 173 are lowered from the state illustrated in FIG. 4E, the wafer WF is supported by only the wafer lifting pins 174, and the second blade 143 is advanced between the carrier C and the wafer WF as illustrated in FIG. 4C, after which the three wafer lifting pins 174 are lowered to load the wafer WF on the second blade 143 as illustrated in FIG. 4B, and the hand of the second robot 141 is operated. In this way, the wafer WF for which treatment has ended can be taken out of the carrier C and into the wafer storage container 15. In the state illustrated in FIG. 4E, the wafer WF for which treatment has ended is transported to the first holder 172 in a state resting on the carrier C, but the wafer WF can be taken out of the carrier C and into the wafer storage container 15 with a similar protocol when the wafer WF is transported to the second holder 173, as well.

Figures 6A, 6B:
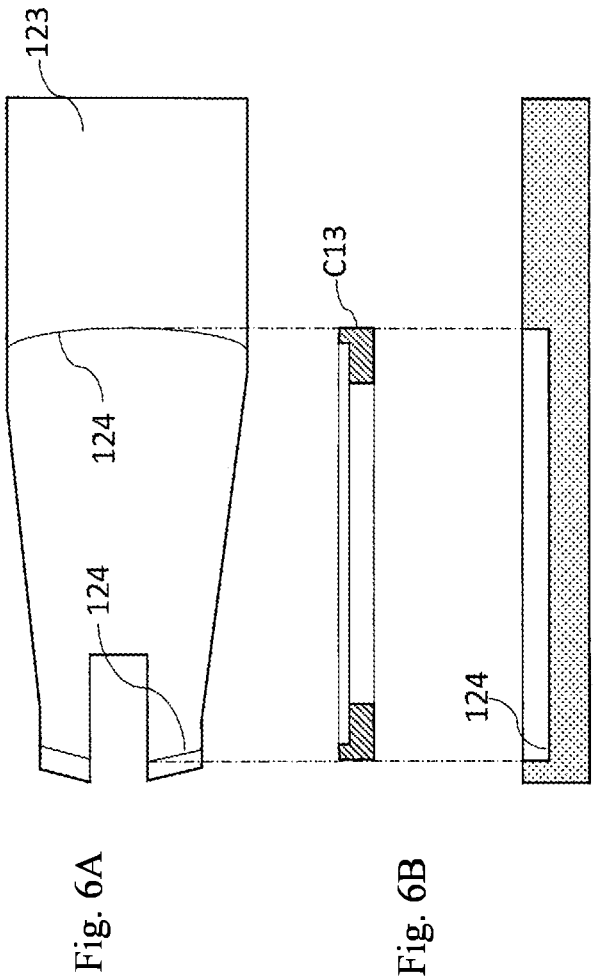
[FIG. 6A] is a plan view illustrating an exemplary first blade mounted on a distal end of a first robot hand in the vapor deposition device of FIG. 1.
FIG. 6B is a cross-sectional view of the first blade, including the carrier and the wafer in the vapor deposition device of FIG. 1.

FIG. 6A is a plan view illustrating an exemplary first blade 123 mounted on the distal end of the hand of the first robot 121 and FIG. 6B is a cross-sectional view of the first blade 123, including the carrier C and the wafer WF. The first blade 123 of the present embodiment has a first recess 124 with a diameter corresponding to the outer circumferential wall surface C13 of the carrier C formed on one surface of a main body which is in a strip plate shape. The diameter of the first recess 124 is formed slightly larger than the diameter of the outer circumferential wall surface C13 of the carrier C. The first robot 121 places the carrier C on the first recess 124 when transporting the empty carrier C or with the wafer WF placed thereon.

Next, a protocol is described for handling the carrier C and the wafer WF prior to creating the epitaxial film (hereafter referred to simply as "before-treatment") and after creating the epitaxial film (hereafter referred to simply as "after-treatment") in the vapor deposition device 1 according to the present embodiment. FIGS. 10A to 10D are schematic views illustrating a handling protocol for the wafer and the carrier in the vapor deposition device of the present embodiment and correspond to the wafer storage container 15, the load-lock chamber 13, and the reaction furnace 11 on one side in FIG. 1; a plurality of wafers W1, W2, W3, . . . (for example, a total of 25 wafers) are stored in the wafer storage container 15 and treatment is initiated in that order.

Figure 10A:
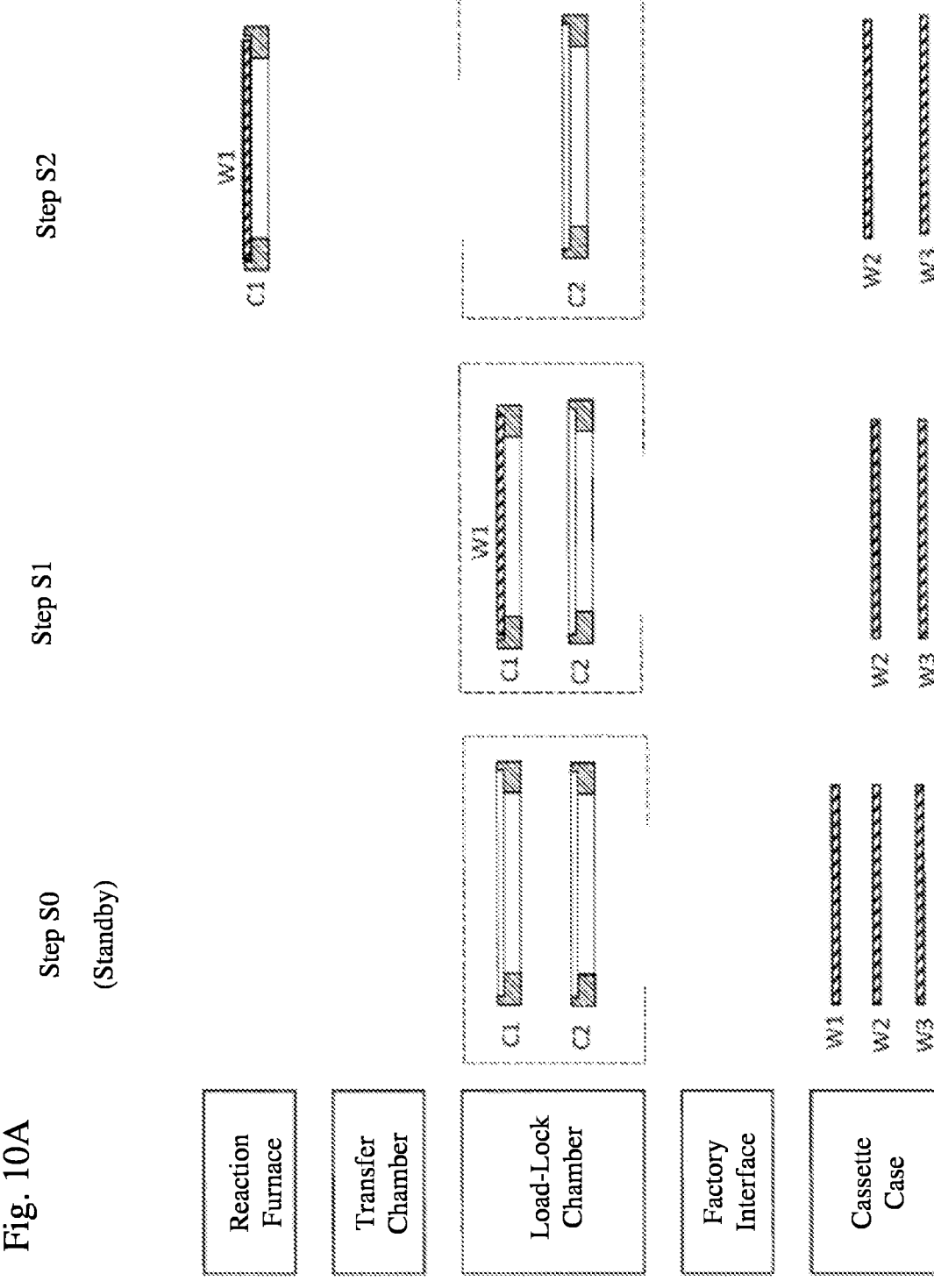
[FIG. 10A] is a diagram (no. 1) illustrating a handling protocol for the wafer and the carrier in the vapor deposition device of FIG. 1.
Figure 10B:
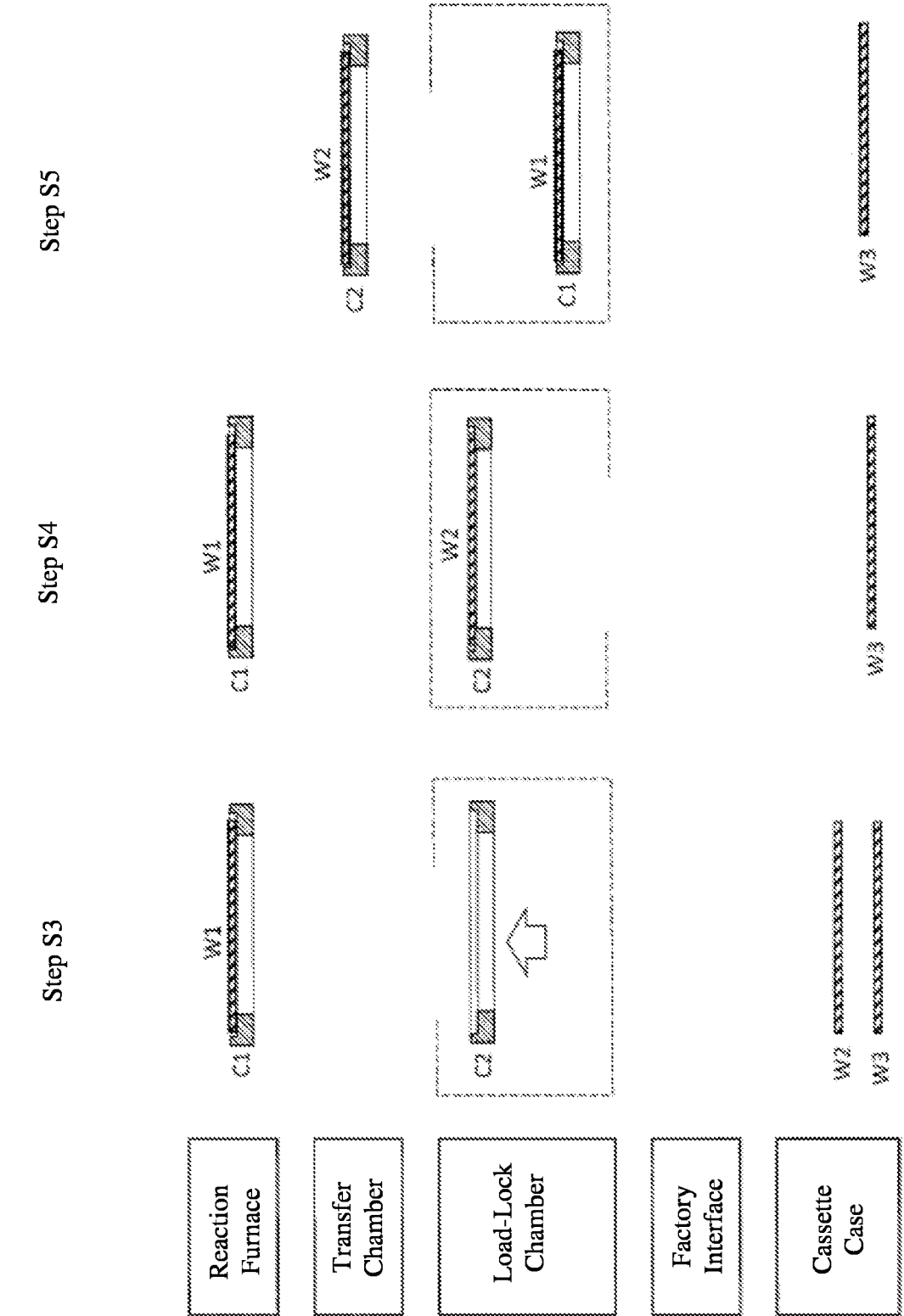
[FIG. 10B] is a diagram (no. 2) illustrating the handling protocol for the wafer and the carrier in the vapor deposition device of FIG. 1.
Figure 10C:
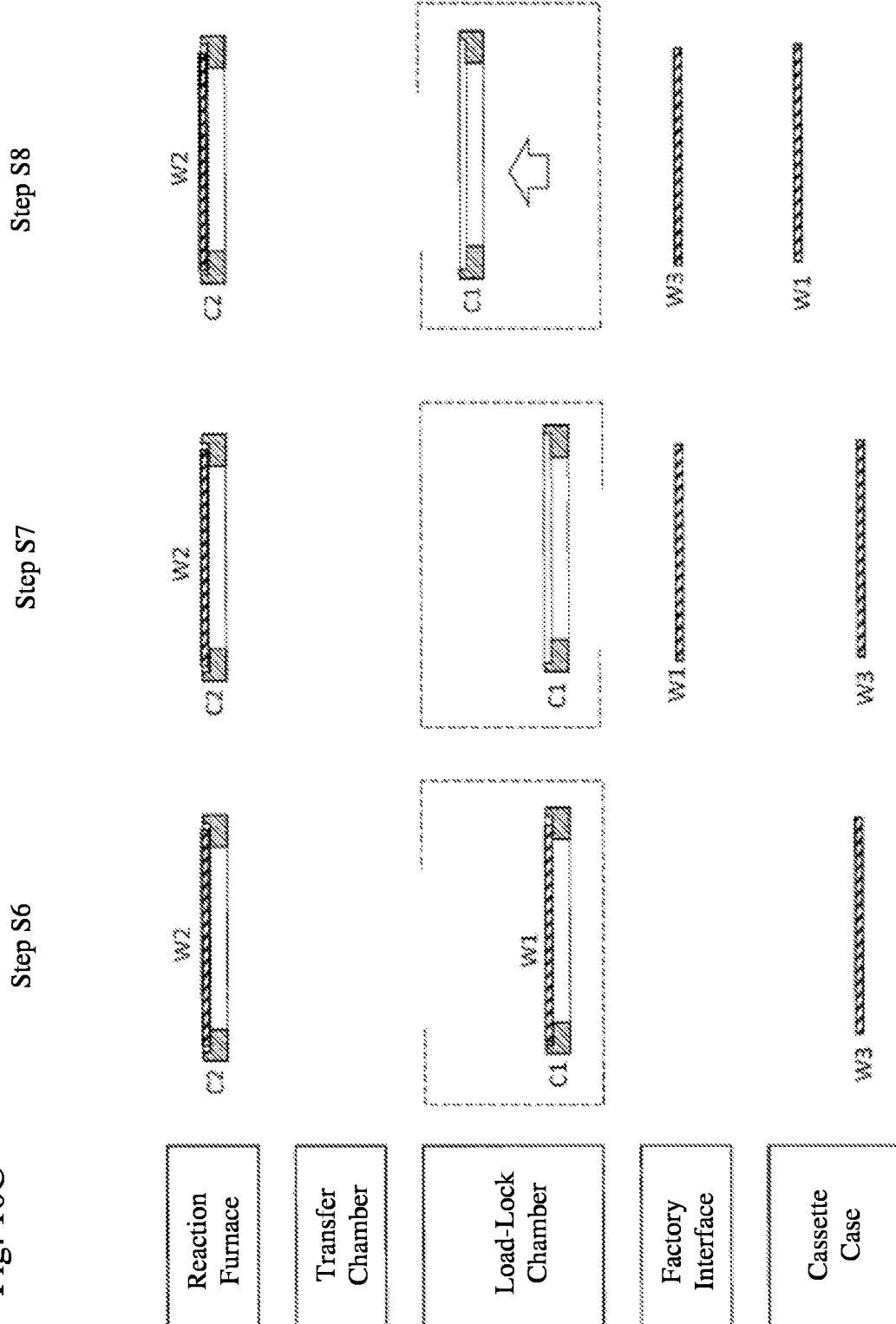
[FIG. 10C] is a diagram (no. 3) illustrating the handling protocol for the wafer and the carrier in the vapor deposition device of FIG. 1.
Figure 10D:
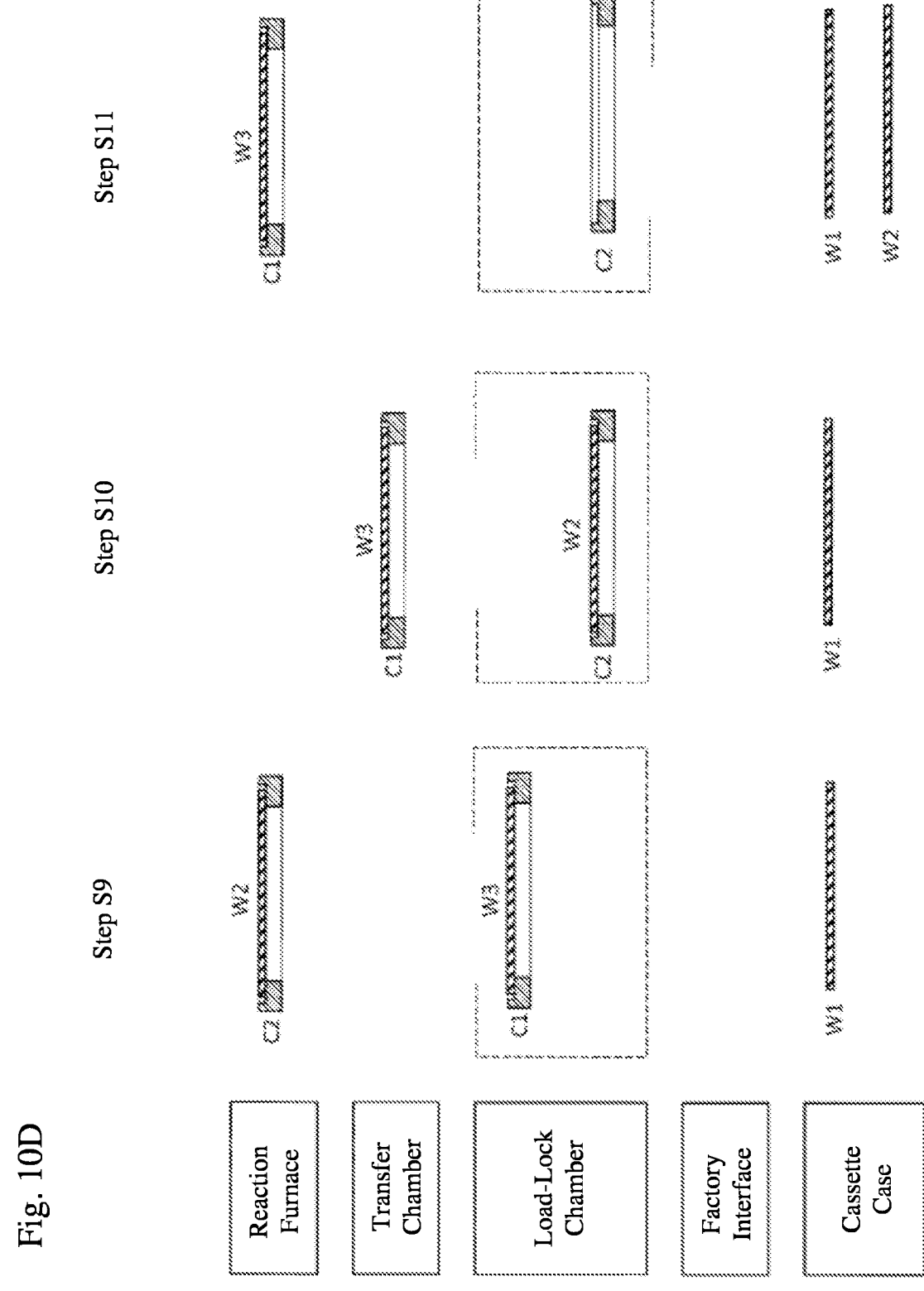
[FIG. 10D] is a diagram (no. 4) illustrating the handling protocol for the wafer and the carrier in the vapor deposition device of FIG. 1.

Step S0 in FIG. 10A shows a standby state from which treatment using the vapor deposition device 1 is to begin, and has the plurality of wafers W1, W2, W3 . . . (for example, a total of 25 wafers) stored in the wafer storage container 15, has an empty carrier C1 supported by the first holder 172 of the load-lock chamber 13, has an empty carrier C2 supported by the second holder 173, and has an inert gas atmosphere in the load-lock chamber 13.

In the next step S1, the second robot 141 loads the wafer W1 that is stored in the wafer storage container 15 onto the second blade 143 and opens the first door 131 of the load-lock chamber 13 and transfers to the carrier C1 that is supported by the first holder 172. The protocol for this transfer was described with reference to FIG. 4.

In the next step S2, the first door 131 of the load-lock chamber 13 is closed and, in a state where the second door 132 is also closed, the interior of the load-lock chamber 13 again undergoes gas exchange to the inert gas atmosphere. Then, the second door 132 is opened, the carrier C1 is loaded onto the first blade 123 of the first robot 121, the gate valve 114 of the reaction furnace 11 is opened, and the carrier C1 on which the wafer W1 is mounted is transferred through the gate valve 114 to the susceptor 112. The protocol for this transfer was described with reference to FIG. 4. In steps S2 to S4, the CVD film creation process is performed on the wafer W1 in the reaction furnace 11.

In other words, the carrier C1 on which the before-treatment wafer W1 is mounted is transferred to the susceptor 112 of the reaction chamber 111 and the gate valve 114 is closed, and after waiting a predetermined amount of time, the gas supply device 113 supplies hydrogen gas to the reaction chamber 111, giving the reaction chamber 111 a hydrogen gas atmosphere. Next, the wafer W1 in the reaction chamber 111 is heated to a predetermined temperature by the heat lamp and pretreatment such as etching or heat treatment is performed as necessary, after which the gas supply device 113 supplies raw material gas while controlling the flow volume and/or supply time. This creates a CVD film on the surface of the wafer W1. Once the CVD film is formed, the gas supply device 113 once again supplies the reaction chamber 111 with hydrogen gas and the reaction chamber 111 undergoes gas exchange to a hydrogen gas atmosphere, after which the protocol stands by for a predetermined amount of time.

In this way, while the reaction furnace 11 is treating the wafer W1 in steps S2 to S4, the second robot 141 extracts the next wafer W2 from the wafer storage container 15 and prepares for the next treatment. Prior to this, in step S3 in the present embodiment, the second door 132 of the load-lock chamber 13 is closed, and in a state where the first door 131 is also closed, the interior of the load-lock chamber 13 undergoes gas exchange to an inert gas atmosphere. Then, the second door 132 is opened, the carrier C2 supported by the second holder 173 is transferred to the first holder 172 by the first robot 121, and the second door 132 is closed. Subsequently, in step S4, the second robot 141 loads the wafer W2 that was stored in the wafer storage container 15 onto the second blade 143, the first door 131 is opened, and the wafer W2 is transferred to the carrier C2 that is supported by the first holder 172 of the load-lock chamber 13.

In this way, in the present embodiment, step S3 is added and the before-treatment wafer WF that was stored in the wafer storage container 15 is mounted on the first holder 172, which is the topmost-level holder of the holder 17 of the load-lock chamber 13. This is for the following reasons. Specifically, as illustrated in step S2, when the empty carrier C2 on which the next wafer W2 is to be mounted is supported by the second holder 173, once the wafer W2 is mounted thereof, there is a possibility that the carrier C1 on which the after-treatment wafer W1 is mounted may be transferred to the first holder 172. The carrier C of the vapor deposition device 1 according to the present embodiment is transported to the reaction chamber 111, and therefore the carrier C is a factor in particle production, and when the carrier C1 is supported on top of the before-treatment wafer W2, dust may fall on the before-treatment wafer W2. Therefore, step S3 is added and the empty carrier C2 is transferred to the first holder 172 so that the before-treatment wafer WF is mounted on the topmost-level holder (first holder 172) of the holder 17 of the load-lock chamber 13.

In step S5, the first door 131 of the load-lock chamber 13 is closed and, in a state where the second door 132 is also closed, the interior of the load-lock chamber 13 undergoes gas exchange to an inert gas atmosphere. Then, the gate valve 114 of the reaction furnace 11 is opened, the first blade 123 of the first robot 121 is inserted into the reaction chamber 111 and is loaded with the carrier C1 on which the after-treatment wafer W1 is mounted, the carrier C1 is withdrawn from the reaction chamber 111, and the gate valve 114 is closed, after which the second door 132 is opened and the carrier C1 is transferred to the second holder 173 of the load-lock chamber 13. Subsequently, the carrier C2 supported by the first holder 172 is loaded onto the first blade 123 of the first robot 121 and, as illustrated in step S6, the gate valve 114 is opened and the carrier C2 on which the before-treatment wafer W2 is mounted is transferred through the wafer transfer chamber 12 to the susceptor 112 of the reaction furnace 11.

In steps S6 to S9, the CVD film creation process is performed on the wafer W2 in the reaction furnace 11. In other words, the carrier C2 on which the before-treatment wafer W2 is mounted is transferred to the susceptor 112 of the reaction chamber 111 and the gate valve 114 is closed, and after waiting a predetermined amount of time, the gas supply device 113 supplies hydrogen gas to the reaction chamber 111, giving the reaction chamber 111 a hydrogen gas atmosphere. Next, the wafer W2 in the reaction chamber 111 is heated to a predetermined temperature by the heat lamp and pretreatment such as etching or heat treatment is performed as necessary, after which the gas supply device 113 supplies raw material gas while controlling the flow volume and/or supply time. This creates a CVD film on the surface of the wafer W2. Once the CVD film is formed, the gas supply device 113 once again supplies the reaction chamber 111 with hydrogen gas and the reaction chamber 111 undergoes gas exchange to a hydrogen gas atmosphere, after which the protocol stands by for a predetermined amount of time.

In this way, while the reaction furnace 11 is treating the wafer W2 in steps S6 to S9, the second robot 141 stores the after-treatment wafer W1 in the wafer storage container 15 and also extracts the next wafer W3 from the wafer storage container 15 and prepares for the next treatment. In other words, in step S7, the second door 132 of the load-lock chamber 13 is closed, and in a state where the first door 131 is also closed, the interior of the load-lock chamber 13 undergoes gas exchange to an inert gas atmosphere. Then, the first door 131 is opened, the second robot 141 loads the after-treatment wafer W1 onto the second blade 143 from the carrier C1 supported by the second holder 173 and, as illustrated in step S8, the after-treatment wafer W1 is stored in the wafer storage container 15. Subsequently, similarly to step S3 described above, in step S8, the first door 131 of the load-lock chamber 13 is closed, and in a state where the second door 132 is also closed, the interior of the load-lock chamber 13 undergoes gas exchange to an inert gas atmosphere. Then, the second door 132 is opened, the carrier C1 supported by the second holder 173 is transferred to the first holder 172 by the first robot 121.

Subsequently, in step S9, the second door 132 of the load-lock chamber 13 is closed, and in a state where the first door 131 is also closed, the interior of the load-lock chamber 13 undergoes gas exchange to an inert gas atmosphere. Then, the second robot 141 loads the wafer W3 that was stored in the wafer storage container 15 onto the second blade 143 and, as illustrated in step S9, the first door 131 is opened and the wafer W3 is transferred to the carrier C1 that is supported by the first holder 172 of the load-lock chamber 13.

In step S10, similarly to step S5 described above, the first door 131 of the load-lock chamber 13 is closed, and in a state where the second door 132 is also closed, the interior of the load-lock chamber 13 undergoes gas exchange to an inert gas atmosphere. Then, the gate valve 114 of the reaction furnace 11 is opened, the first blade 123 of the first robot 121 is inserted into the reaction chamber 111 and is loaded with the carrier C2 on which the after-treatment wafer W2 is mounted, and the gate valve 114 is closed, after which the second door 132 is opened and the carrier C2 is transferred from the reaction chamber 111 to the second holder 173 of the load-lock chamber 13. Subsequently, the carrier C1 supported by the first holder 172 is loaded onto the first blade 123 of the first robot 121 and, as illustrated in step S11, the carrier C1 on which the before-treatment wafer W3 is mounted is transferred through the wafer transfer chamber 12 to the susceptor 112 of the reaction furnace 11.

In step S10, similarly to step S7 described above, the second door 132 of the load-lock chamber 13 is closed, and in a state where the first door 131 is also closed, the interior of the load-lock chamber 13 undergoes gas exchange to an inert gas atmosphere. Then, the first door 131 is opened, the second robot 141 loads the post-treatment wafer W2 onto the second blade 143 from the carrier C2 that is supported on the second holder 173 and, as illustrated in step S11, the post-treatment wafer W2 is stored in the wafer storage container 15. Thereafter, the above steps are repeated until treatment for all of the before-treatment wafers WF stored in the wafer storage container 15 ends.

As described above, in the vapor deposition device 1 of the present embodiment, when the susceptor 112 supporting the carrier C on which the wafer WF is placed is viewed in the plan view, by installing the carrier lift pins 115 outside of the outer edge of the wafer WF, the influence on the CVD film which is caused by the position of the carrier lift pins 115 can be suppressed, without adjusting the heat of the wafer. In this case, when centers of the carrier lift pins 115 are positioned outside of the outer edge of the wafer WF by 7 mm or more, the influence on the CVD film which is caused by the positions of the carrier lift pins 115 can be further suppressed.

Also, when the susceptor 112 on which the carrier C supporting the wafer WF is placed is viewed in the plan view, by treating the wafer WF using the vapor deposition device 1 of the present embodiment in which the carrier lift pins 115 are installed outside of the outer edge of the wafer WF, a wafer WF on which the CVD film is formed with the influence of the carrier lift pins 115 being suppressed can be obtained, without adjusting the heat of the wafer WF.

DESCRIPTION OF REFERENCE NUMERAL

1 Vapor deposition device
11 Reaction furnace
111 Reaction chamber
112 Susceptor
113 Gas supply device
114 Gate valve
115 Carrier lift pin
12 Wafer transfer chamber
121 First robot
122 First robot controller
123 First blade
124 First recess
13 Load-lock chamber
131 First door
132 Second door
14 Factory interface
141 Second robot
142 Second robot controller
143 Second blade
15 Wafer storage container
16 Integrated controller
17 Holder
171 Holder base
172 First holder
173 Second holder
174 Wafer lift pin C Carrier
C11 Bottom surface
C12 Top surface
C13 Outer circumferential wall surface
C14 Inner circumferential wall surface
WF Wafer

The invention claimed is:

1. A vapor deposition device, comprising:

a reaction chamber, including at least a susceptor and a carrier lift pin, for forming a CVD film on a wafer, a gas supply device configured to supply raw material gas for growing the CVD film to the reaction chamber, and a ring-shaped carrier having an opening in a middle portion that does not contact the wafer, and the ring shaped carrier is configured to support an outer periphery of the wafer such that a space is provided between the susceptor and a portion of the wafer provided in the middle portion of the ring-shaped carrier, wherein the reaction chamber is provided with the susceptor on which the ring-shaped carrier supporting the wafer is placed, and the carrier lift pin which moves the ring-shaped carrier supporting the wafer vertically relative to, and independent of, the susceptor, the carrier lift pin is installed outside of an outer edge of the wafer in a state in which the ring-shaped carrier supporting the wafer is mounted on the susceptor is viewed in a plan view, the carrier lift pin is installed such that a center of the carrier lift pin is positioned outside of the outer edge of the wafer by 7 mm or more in a state in which the ring-shaped carrier supporting the wafer is mounted on the susceptor is viewed in the plan view, and the susceptor includes at least a through hole extended vertically through the susceptor in the plan view, in which the carrier lift pin is provided, such that the carrier lift pin is configured to press against the bottommost surface of the ring-shaped carrier.

2. The vapor deposition device according to claim 1, wherein the CVD film is a silicon epitaxial film.

3. The vapor deposition device according to claim 1, wherein a plurality of before-treatment wafers are transported from a wafer storage container, through a factory interface, a load-lock chamber, and a wafer transfer chamber to the reaction chamber that forms the CVD film on the wafers in that order, and a plurality of after-treatment wafers are transported from the reaction chamber, through the wafer transfer chamber, the load-lock chamber, and the factory interface to the wafer storage container in that order, and the load-lock chamber communicates with the factory interface via a first door and also communicate with the wafer transfer chamber via a second door, the wafer transfer chamber communicates with the reaction chamber via a gate valve, the wafer transfer chamber is provided with a first robot that deposits a before-treatment wafer, transported into the load-lock chamber, into the reaction chamber in a state in which the before-treatment wafer is supported on the ring-shaped carrier, and also, for an after-treatment wafer for which treatment in the reaction chamber has ended, withdraws the after-treatment wafer from the reaction chamber in a state in which the after-treatment wafer is supported on the ring-shaped carrier and transports the wafer to the load-lock chamber, the factory interface is provided with a second robot which extracts the before-treatment wafer from the wafer storage container and supports the wafer by the ring-shaped carrier standing by in the load-lock chamber, and also stores in the wafer storage container the after-treatment wafer supported on the ring-shaped carrier that has been transported to the load-lock chamber, and the load-lock chamber is provided with a holder for supporting the ring-shaped carrier.

4. The vapor deposition device according to claim 1, wherein the ring-shaped carrier includes a stepped portion, having an upper portion and a lower portion, in which the lower portion is configured to receive the wafer on a bottom surface of the lower portion, and the center of the carrier lift pin is provided at a position outside of an outermost radius of the bottom surface.

* * * * *